United States Patent
Ubukata

(12) 
(10) Patent No.: US 6,469,894 B2
(45) Date of Patent: Oct. 22, 2002

(54) APPARATUS FOR COOLING AN ELECTRONIC COMPONENT AND ELECTRONIC DEVICE COMPRISING THE APPARATUS

(75) Inventor: Hiroshi Ubukata, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/955,069

(22) Filed: Sep. 19, 2001

(65) Prior Publication Data
US 2002/0126453 A1 Sep. 12, 2002

(30) Foreign Application Priority Data
Mar. 8, 2001 (JP) .......................................... 2001-065252

(51) Int. Cl.[7] ................................................. H05K 7/20
(52) U.S. Cl. ................... 361/700; 165/104.33; 257/714; 361/719
(58) Field of Search ................................. 257/706, 707, 257/712–714, 718, 719, 726, 727; 174/16.3, 252; 454/184; 165/80.3, 80.4, 185, 104.22, 104.33; 62/259.2; 361/695–700, 703–705, 707–712, 717–719

(56) References Cited

U.S. PATENT DOCUMENTS 6,311,767 B1 * 11/2001 Inoue et al. ................ 165/80.4
6,394,175 B1 * 5/2002 Chen et al. ................ 165/80.3
6,399,877 B1 * 6/2002 Sakamoto .................. 174/16.3

FOREIGN PATENT DOCUMENTS

| JP | 08-303969 | 11/1996 |
| JP | 9-331177 | 12/1997 |
| JP | 11-097596 | 4/1999 |
| JP | 11-351769 | 12/1999 |

* cited by examiner

Primary Examiner—Gerald Tolin
(74) Attorney, Agent, or Firm—Finnegan, Henderson, Farabow, Garrett & Dunner, L.L.P.

(57) ABSTRACT

An apparatus for cooling an electric component is provided on an electronic component mounted on a printed circuit board. The apparatus comprises a heat radiation member having a base contacting the electronic component such that heat can be conducted, and a plurality of heat radiation fins provided and standing integrally on the side of the base which is distant from the electronic component. The electronic component and the heat radiation member are surrounded by a duct member which lets air flow through the heat radiation fins. Top ends of the plurality of heat radiation fins which are distant from the base are connected to the duct member such that heat can be conducted. The duct member and the base are connected through a heat pipe such that heat can be conducted.

16 Claims, 2 Drawing Sheets

APPARATUS FOR COOLING AN ELECTRONIC COMPONENT AND ELECTRONIC DEVICE COMPRISING THE APPARATUS

CROSS-REFERENCE TO RELATED APPLICATIONS

This application is based upon and claims the benefit of priority from the prior Japanese Patent Application No. 2001-065252, filed Mar. 8, 2001, the entire contents of which are incorporated herein by reference.

BACKGROUND OF THE INVENTION

1. Field of the Invention

The present invention relates to, for example, an electronic device for a computer, and particularly to a cooling mechanism for cooling an electronic component incorporated in the electronic device.

2. Description of the Related Art

Recently, in this technical field, increase of the processing speed and multiplication of functions have been promoted with respect to electronic components such as MPU (Micro Processing Unit) and the like which process a large amount of information such as texts, audio, images, and the like. As the processing speed of the MPU increases, the power consumption of the MPU increases so that the heat generation amount also increases. If the heat generation amount of the MPU increases, the heat generation amount of the entire electronic device also increases. If an electronic device generates heat, performance of other electronic components incorporated in the electronic device is damaged in some cases.

Conventionally, to reduce heat generation from the MPU as described above, a cooling mechanism for cooing the MPU is installed on the printed circuit board contained in the casing of the device.

As a cooling mechanism of this kind, for example, Japanese Patent Application KOKAI Publication No. 8-303969 discloses a known cooling mechanism. In the following, the cooling mechanism disclosed in this publication will be explained.

The cooling mechanism includes a main heat receiver, two sub heat receivers, plurality of heat radiation fins, and two heat pipes. A plurality of semiconductor elements as cooling targets are provided in parallel in one surface of the main heat receiver having a rectangular plate-like shape. A plurality of heat radiation fins are provided to stand on the other surface of the main heat receiver. The first sub heat receiver having a rectangular plate-like shape is provided in parallel with the main heat receiver at the top ends of the plurality of heat radiation fins. Further, a plurality of heat radiation fins are provided to stand on the first sub heat receive. The second sub heat receiver is provided in parallel with the main heat receiver, at the top ends of the plurality of heat radiation fins. Further, a plurality of heat radiation fins are provided to stand on the opposite surface of the second sub heat receiver. An end of the first heat pipe extends penetrating through the main heat receiver, and the other end thereof extends penetrating through the first sub heat receiver. An end of the second heat pipe extends penetrating through the heat receiver, and the other end thereof extends penetrating through the second sub heat receiver.

Heat from the semiconductor element is conducted to the main heat receiver and also to the first and second sub heat receivers through two heat pipes. The heat conducted to the heat receivers is conducted to the plurality of heat radiation fins. The heat thus conducted to the plurality of heat radiation fins are radiated out by supplying air to the heat radiation fins.

In this cooling mechanism, however, undesired heat generated as described above, which is caused by increase of the processing speed of the MPU and has come to be a drawback, cannot be sufficiently radiated. A problem has hence arisen in that the temperature inside the casing of the electronic device increases due to heat generation from electronic devices, and damages the performance of the other electronic components.

BRIEF SUMMARY OF THE INVENTION

The present invention has an object of providing a cooling mechanism capable of efficiently radiating heat generated from electronic components, and an electronic device comprising the cooling mechanism.

An apparatus according to the present invention is provided to cool an electronic component mounted on a printed circuit board, and comprises: a heat radiation member having a base and a plurality of heat radiation fins provided and standing integrally on the base, the base thermally contacting the electronic component; a duct member contacting top ends of the plurality of heat radiation fins which are distant from the base, for flowing air through the plurality of heat radiation fins; and a heat pipe connecting the duct member and the base such that heat can be conducted.

An electronic device according to the present invention has a casing including a printed circuit board mounting an electronic component, and an apparatus for cooling the electronic component, wherein the apparatus comprises: a heat radiation member having a base and a plurality of heat radiation fins provided and standing integrally on the base, the base thermally contacting the electronic component; a duct member contacting top ends of the plurality of heat radiation fins which are distant from the base, for flowing air through the plurality of heat radiation fins; and a heat pipe connecting the duct member and the base such that heat can be conducted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the following, an embodiment of the present invention will be specifically explained with reference to the drawings.

Figure 1:
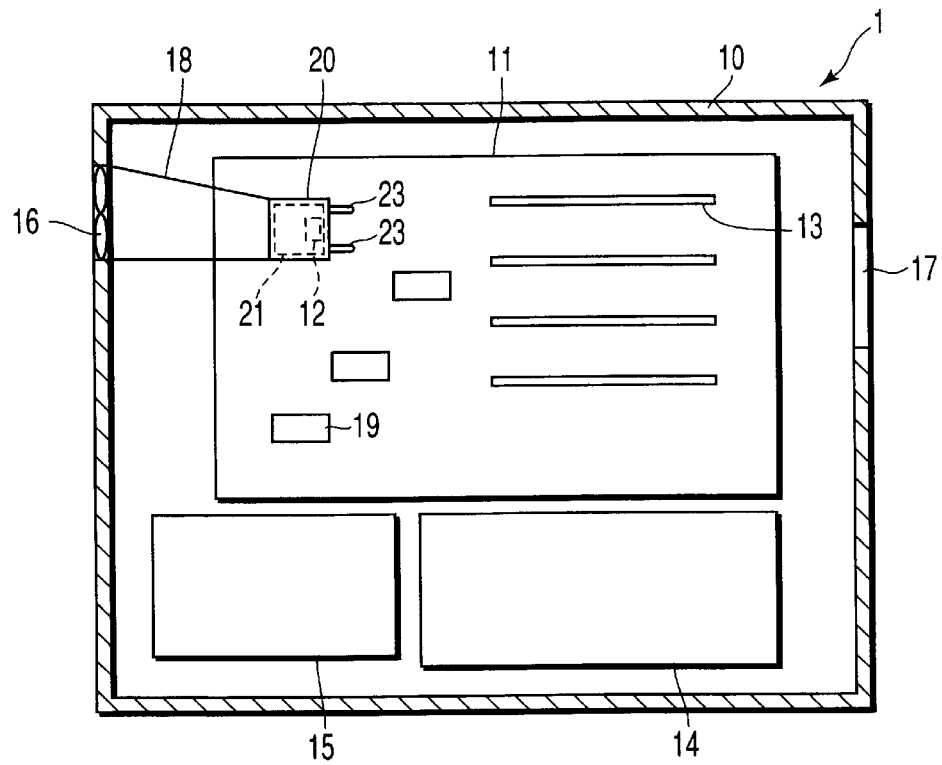
FIG. 1 is a schematic view showing the internal structure of an electronic device according to an embodiment of the present invention.

FIG. 1 shows a schematic structure of an electronic device 1 according to the embodiment of the present invention. The electronic device 1 has a casing 10 in which a printed circuit board 11 is contained and provided. The printed circuit board 11 is provided with electronic components 12 such as an MPU or the like and extension slots 13. The electronic component 12 includes a temperature sensor not shown but comprised of a diode. A power source device 14 and a hard disk drive (HDD) 15 are contained and provided in the casing 10. The power source device 14 and HDD 15 are connected with the printed circuit board 11 and are operated and controlled by the electronic component 12.

An air-intake fan 16 is provided on the wall of the casing 10 in the left side in the figure. The air-intake fan 16 is provided near the electronic component 12. An exhaust port 17 is provided in the wall of the casing 10 in the right side opposite to the air-intake fan 16 with the electronic component 12 interposed therebetween. An air-intake duct 18 made of metal having high heat conduction is provided between the air-intake fan 16 and the electronic component 12. The air-intake duct 18 has an end connected so as to cover the air-intake fan 16 and another end connected to a duct member 20 made of metal having high heat conduction.

Figure 2:
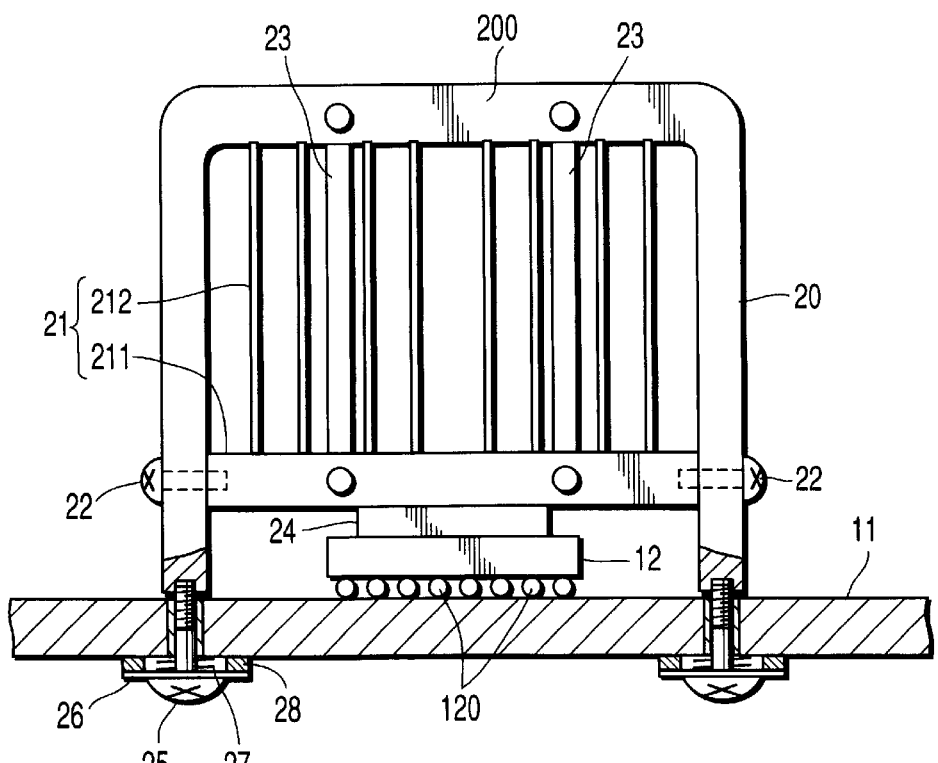
FIG. 2 is a schematic view showing a cooling mechanism for cooling an electronic component incorporated in the electronic device shown in FIG. 1.
Figure 3:
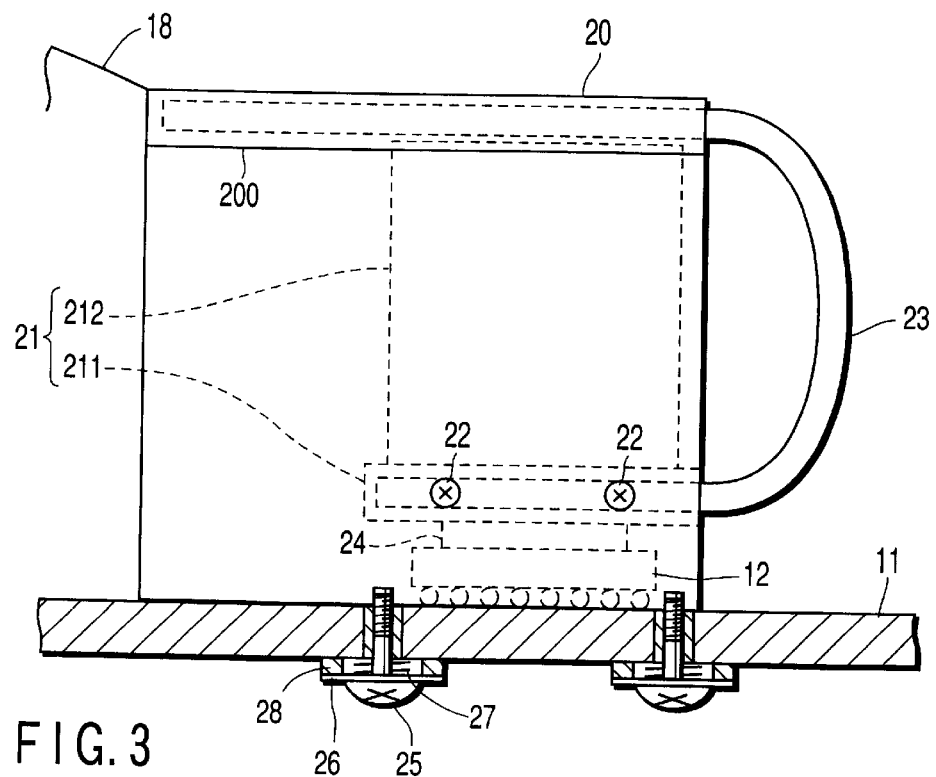
FIG. 3 is a side view of the cooling mechanism shown in FIG. 2.

The duct member 20 has such a shape in which a rectangular plate-like member is bent at two portions in one same direction, as shown in FIGS. 2 and 3. The member 20 is installed on the printed circuit board 11 so as to cover the electronic component 12. Provided also on the printed circuit board 11 is a control chip 19 for operating the air-intake fan 16 in accordance with a detection result of a temperature sensor included in the electronic component 12.

Thus, air supplied into the casing 10 by the air-intake fan 16 passes through the air-intake duct 18 and the duct member 20, and deprives the electronic component 12 of heat. The air which has thus deprived the electronic component 12 of heat is exhausted to the outside of the casing 10 through the exhaust port 17.

Explanation will now be made of a cooling mechanism for depriving the electronic component 12 of heat by air passing through the duct member 20.

As shown in FIGS. 2 and 3, a heat radiation member 21 called a heat sink is provided inside the duct member 20 above the electronic component 12. The heat radiation member 21 has a substantially rectangular plate-like base 211, a plurality of substantially rectangular plate-like heat radiation fins 212 provided to stand substantially at right angles and integrally on the upper surface of the base 211. The lower surface of the base 211 is brought into contact with the upper surface of the electronic component 12 mounted on the-printed circuit board 11, over a relatively large area, with a cool sheet 24 inserted therebetween.

Figure 4:
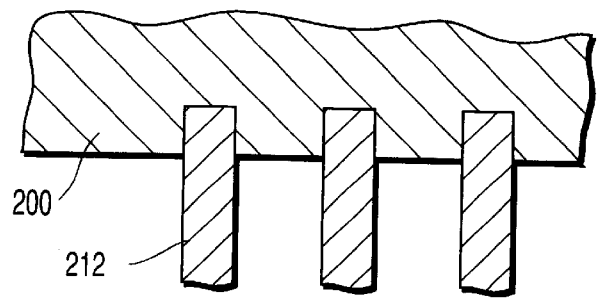
FIG. 4 is a cross-sectional view showing a connecting state between heat radiation fins of the cooling mechanism and a duct member shown in FIG. 2.

The heat radiation fins 212 are provided at a predetermined interval maintained between each other. The base 211 is bridged near both of the bent ends of the duct member 20, such that the heat radiation fins 212 are situated along the flowing direction of air. That is, the base 211 is secured to portions near the lower ends of the duct member 20 by a plurality of screws 22, such that the electronic component 12 is sandwiched between the base 211 and the printed circuit board 11. Also, the top end parts of the plurality of heat radiation fins 212 which are distant from the base 211 are secured, by calking, to the wall part 200 of the duct member 20 which is opposed to the base 211, as enlarged and shown in FIG. 4.

That is, the base 211 is secured to the duct member 20 by screws, and the top end parts of the heat radiation fins 212 are secured to the duct member 20 by calking, so that the heat radiation member 21 is connected, attaining best heat conduction to the duct member 20.

Also, two heat pipes 23 are connected between the heat radiation member 21 and the duct member 20. An end of each heat pipe 23 extends penetrating the inside of the base 211, and another end thereof extends penetrating through the inside of the wall part 200 of the duct member 20. An intermediate part of each heat pipe 23 is curved outside the opening part in the side distant from the air-intake duct 18 of the duct member 20. That is, each heat pipe 23 is connected to the base 211 and the wall part 200, maintaining the best heat conduction.

As described above, a metal adhesion such as a silver paste or a cool sheet may be inserted between members connected with excellent heat conduction, e.g., between the base 211 and the duct member 20, between the heat radiation fins 212 and the wall part 200, between the heat pipes 23 and the base 211, and between the heat pipes 23 and the wall part 200. Alternatively, these members may be connected mechanically by calking or the like. In any cases, it is desirable to adopt a connection state in which the best heat conduction can be obtained between these members.

Note that the cool sheet 24, heat radiation member 21, heat pipes 23, and duct member 20 serve as the cooling mechanism according to the present invention. To improve the cooling efficiency, materials having excellent heat conduction are used as materials forming the respective members of the cooling mechanism.

Figure 5:
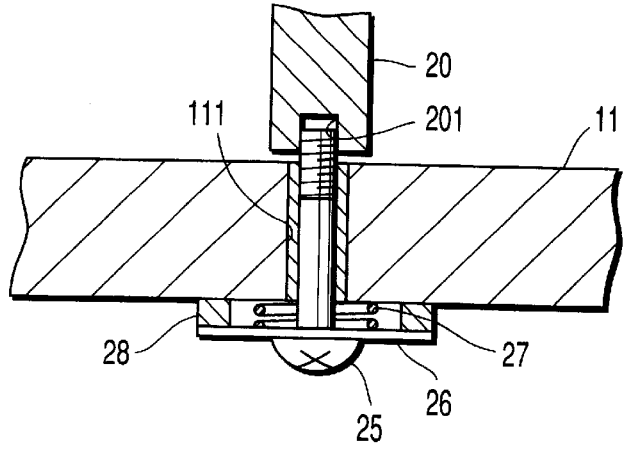
FIG. 5 is a cross-sectional view showing an installation state of the duct member and a printed circuit board shown in FIG. 2.

Meanwhile, two bent end parts of the duct member 20 are connected to the printed circuit board 11, as shown in FIG. 5. That is, a plurality of screw holes 201 are formed in each of the tend parts of the duct member 20. Screws 25 inserted in a plurality of wandering insertion holes 111 formed at corresponding positions on the printed circuit board 11 are screwed in the screw holes 201. More specifically, after the screws 25 are each equipped with a washer 26, a spring member 27, and a spacer member 28, they are inserted into the wandering insertion holes 111 from the back surface side of the printed circuit board 11, and are screwed in the screw holes 201.

At this time, the pressing force against the electronic component 12 of the base 211 can be variably adjusted by adjusting the screwing amount of each screw 25. The screwing length of each screw 25 is defined such that the load of the electronic component 12 to the soldered connecting portions 120 on the printed circuit board 11 is smaller than a tolerable value in a state that the screws 25 are perfectly screwed in the screw holes 201. In this manner, the soldered connecting portions of the electronic are prevented from damages.

Next, heat radiation operation of the electronic component 12 based on the cooling mechanism will be explained.

At first, the electronic component 12 on the printed circuit board 11 is driven by power supplied from the power source device 14 and generates heat. The heat from the electronic component 12 is conducted to the base 211 of the heat radiation member 21 through the cool sheet 24 which contacts the upper surface of the component 12.

The heat thus conducted to the base 211 is conducted to the plurality of heat radiation fins 212 provided and standing on the upper surface of the base 211, to the portions near both ends of the duct member 20 where the base 211 is bridged, and to the wall part 200 of the duct member 20 through the two heat pipes 23. The heat conducted to the wall part 200 of the duct member 20 through the two heat pipes 23 is further conducted to the heat radiation fins 212 from the top end side of the plurality of heat radiation fins 212. By adopting this structure, heat can be efficiently conducted from both ends of each heat radiation fin 212, and the duct member 20 itself and the heat pipes 23 themselves can be let function as heat radiation members. Further, heat is also conducted to the air-intake duct 18 connected to the duct member 20.

When the control chip 19 detects that the temperature of the electronic component 12 has reached a preset temperature by means of the temperature sensor incorporated in the electronic component 12, the air-intake fan 16 is driven so that air is supplied into the casing 10. The air is fed into the duct member 20 through the air-intake duct 18 and flows along the plurality of heat radiation fins 212 of the heat radiation member 21, thereby depriving the heat radiation fins 212 of heat. Further, the air exhausted from the duct member 20 passes through the exhaust port 17 of the casing 10 and is exhausted to the outside of the casing. In this manner, the heat radiation fins 212 of the heat radiation member 21 are cooled so that the electronic component 12 contacting the heat radiation member 21 is cooled.

As has been described above, according to the present embodiment, heat is conducted from the side of the base end parts of the plurality of heat radiation fins 212 through the base 211 of the heat radiation member 21 provided in contact with the electronic member 12 and is also conducted from the side of the top end parts of the heat radiation fins 212 through the wall part 260 of the duct member 20 connected to the base 211 through the heat pipes 23. Therefore, the heat from the electronic component 12 can be effectively conducted to the plurality of heat radiation fins 212. As a result, the area of the heat radiation fins 212 to be heated can be sufficiently increased, compared with a conventional cooling mechanism. The heat radiation effect is thus greatly improved.

Also, in the present embodiment, the duct member 20 and the air-intake duct 18 for feeding air to the heat radiation member 21 also serve as heat radiation members. Therefore, the area of the heat radiation member that is exposed to the air can be increased much more, so that the heat radiation effect can be improved much more.

Further, according to the present embodiment, the cooling mechanism for cooling the electronic component 12 mounted on the printed circuit board 11 can be installed together, by merely installing the duct member 20 to which the heat radiation member 21 is fixed, on the printed circuit board 11. The services for installing the cooling mechanism can thus be simplified. Also, the duct member 20 and the heat radiation member 21 are integrated together, so that the cooling mechanism is downsized and the electronic device can also downsized accordingly.

Additional :advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, in the above embodiment, the duct member 20 is provided so as to cover the entire heat radiation member 21. The present invention, however, is not limited thereto. For example, the duct member 20 may be provided so as to cover a part of the heat radiation member 21.

Also, in the above embodiment, one cooling mechanism is installed for one electronic component mounted on the printed circuit board 11. The present invention, however, is not limited thereto but one cooling mechanism may be installed for two electronic components or for every plural electronic components. Alternatively, a cooling mechanism in which two heat radiation members 21 are layered may be installed for one electronic component 12.

Further, the above embodiment adopts an air-path structure in which the duct member 20 and the air-intake fan 16 are connected by the air-intake duct 18. The present invention, however, is not limited thereto but the air-intake duct 18 need not always be inserted between the duct member 20 and the air-intake fan 16. In addition, in place of the air-intake fan, an exhaust fan may be provided at the exhaust port 17.

What is claimed is:

1. An apparatus for cooling an electronic component mounted on a printed circuit board, comprising:
    a heat radiation member having a base and a plurality of heat radiation fins provided and standing integrally on the base, the base thermally contacting the electronic component;
    a duct member contacting top ends of the plurality of heat radiation fins which are distant from the base, for flowing air through the plurality of heat radiation fins; and
    a heat pipe connecting the duct member and the base such that heat can be conducted.

2. The apparatus according to claim 1, wherein the base is fixed to the duct member.

3. The apparatus according to claim 2, wherein the top ends of the plurality of heat radiation fins are connected with a wall part of the duct member which extends substantially in parallel with the base.

4. The apparatus according to claim 3, wherein an end of the heat pipe is connected to the wall part.

5. The apparatus according to claim 2, wherein the base contacts the electronic component through a cool sheet.

6. The apparatus according to claim 5, wherein the duct member is installed on the printed circuit board, to press the base against the electronic component through the cool sheet.

7. The apparatus according to claim 6, wherein the duct member and the printed circuit board are connected such that a pressing force of the base against the electronic component can be adjusted.

8. An electronic device having a casing including a printed circuit board mounting an electronic component, and an apparatus for cooling the electronic component, wherein the apparatus comprises:

a heat radiation member having a base and a plurality of heat radiation fins provided and standing integrally on the base, the base thermally contacting the electronic component;

a duct member contacting top ends of the plurality of heat radiation fins which are distant from the base, for flowing air through the plurality of heat radiation fins; and a heat pipe connecting the duct member and the base such that heat can be conducted.

9. The electronic device according to claim 8, wherein the base is fixed to the duct member.

10. The electronic device according to claim 9, wherein the top ends of the plurality of heat radiation fins are connected with a wall part of the duct member which extends substantially in parallel with the base.

11. The electronic device according to claim 10, wherein an end of the heat pipe is connected to the wall part.

12. The electronic device according to claim 9, wherein the base contacts the electronic component through a cool Sheet.

13. The electronic device according to claim 12, wherein the duct member is installed on the printed circuit board, to press the base against the electronic component through the cool sheet.

14. The electronic device according to claim 13, wherein the duct member and the printed circuit board are connected such that a pressing force of the base against the electronic component can be adjusted.

15. The electronic device according to claim 8, wherein the casing is provided with an air-intake fan for feeding air into the casing, and an exhaust port for exhausting air fed into the casing.

16. The electronic device according to claim 15, wherein the casing further has an air-intake duct which connects the air-intake fan and the duct member with each other.

* * * * *